United States Patent [19]

Sanada

[11] Patent Number: 6,144,084

[45] Date of Patent: *Nov. 7, 2000

[54] SEMICONDUCTOR INTEGRATED CIRCUIT HAVING A LOGIC VERIFYING STRUCTURE AND METHOD OF MANUFACTURING THE SAME

[75] Inventor: Masaru Sanada, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/031,542

[22] Filed: Feb. 27, 1998

[30] Foreign Application Priority Data

Feb. 27, 1997 [JP] Japan .................................... 9-044004

[51] Int. Cl.[7] .................................................. H01L 29/80
[52] U.S. Cl. ............................................................ 257/443
[58] Field of Search ............................................. 257/443

[56] References Cited

U.S. PATENT DOCUMENTS 5,329,139  7/1994  Sanada .
5,804,847  9/1998  Robinson .
5,841,126  11/1998  Fossum et al. .

FOREIGN PATENT DOCUMENTS 5-326717  12/1993  Japan .

OTHER PUBLICATIONS

Henley, "Logic Failure Analysis Of CMOS VLSI Using A Laser Probe", *IEEE Proceedings of the International Reliability Physics Symposium*, pp. 69–75.

Ueda et al., "Back–Side OBIC Scanner", *LSI Testing Symposium*, pp. 164–169, (1996).

*Primary Examiner*—Stephen D. Meier
*Attorney, Agent, or Firm*—Foley & Lardner

[57] ABSTRACT

A semiconductor integrated circuit having a logic verification structure includes a logic circuit formed by CMOS structure on a semiconductor substrate, in which the semiconductor integrated circuit has an impurity region irradiated by a laser beam from a back of the semiconductor substrate, for testing the logic circuit, achieving a simple logic analysis.

17 Claims, 18 Drawing Sheets

SEMICONDUCTOR INTEGRATED CIRCUIT HAVING A LOGIC VERIFYING STRUCTURE AND METHOD OF MANUFACTURING THE SAME

BACKGROUND OF THE INVENTION

1. Field of the Invention

The present invention relates to a semiconductor device, more particularly to a semiconductor integrated circuit having a logic verifying structure capable of detecting internal logic states by irradiating a laser beam on the back of the semiconductor integrated circuit having logic circuits constituted by CMOS (Complimentary Metal Oxide Semiconductor) structure, and to a method of manufacturing the semiconductor integrated circuit.

2. Description of the Related Art

There have proposed test systems for detecting internal logic states of a CMOS LSI (Large Scale Integrated Circuit) with non-contacts arranged on the LSI: a system analyzes secondary electrons generated from wiring of the LSI by irradiating an electron beam on the wiring; another system detects an electron beam excitation current generated from a logic of pn junction portions of a semiconductor device for use in an electronic circuit by irradiating an electron beam referred to as an EBIC (Electron Beam Induced Current) on the pn junction; and still another system detects a photo current generated from a logic of a pn junction portion of a semiconductor device for use in an electronic circuit by irradiating a laser beam referred to as an OBIC (Optical Beam Induced Current) on the pn junction.

Since the electron beam should be irradiated on a measuring sample in a space maintained under high vacuum, equipment cost is necessarily high.

Moreover, since a space maintained under high vacuum has physical limitations, the size of the LSI circuit to be measured and the number of input and output terminals are also limited. In contrast, since the laser beam used by the OBIC system can be used in the air, there is no limitation to use a specifically designed electron beam equipment and an LSI to be measured. To this end, the OBIC system for detecting internal logic states in the non-contact has been attracted considerably attention.

Such system has proposed in detail by "Logic Failure Analysis of CMOS LSI Using a Laser Probe", F. J. Henley, IEEE Proceedings of the International Reliability Physics Symposium, 1984, pp 60–75.

Concerning the OBIC system, a system referred to as back OBIC has been proposed which detects a photo current generated from a logic of pn junction portion by irradiating a laser light on the pn junction portion from the back of a semiconductor substrate opposite to a plane on which an electronic circuit is formed, which has been turned to practical use. Such system has proposed in detail by "the back OBIC Scanner" published by Katsuhide UEDA and Kenji HARADA, LSI Testing Symposium, the minutes in 1996, pp 164–169.

Logic Verification of The Back OBIC System

The dynamic measurement of a CMOS logic circuit is possible using an OBIC generated on an external electrode terminal of the LSI by irradiation laser light (which is mainly used with He—Ne laser) on the depletion layer of a drain region of CMOS gate.

FIG. 12 is a diagram showing an OBIC detecting apparatus using the He—Ne laser. Referring to FIG. 12, a laser beam is irradiated on a drain portion of a CMOS gate of an LSI 22 from a He—Ne laser oscillator 20 through a microscope 21. The power source and signal for the LSI 22 are supplied from a power and signal source 24 (in which the signal supply has been simple with a tester directly connected) to a stage 23 through an OBIC detector 25. An OBIC generated by the laser beam irradiation is detected and outputted from the OBIC detector 25.

FIG. 13 is a block diagram in more detail for describing the detection of OBIC which is already described with reference to FIG. 12. Referring to FIG. 13, when an OBIC or a photo excitation current (hereinafter, abbreviated to Iph) is generated in the LSI 22 irradiated by the laser beam with the power source and signal inputted, a current flows from a source voltage terminal VDD to the LSI 22 through the OBIC detector 25. At this time, the OBIC detector 25 generates amicro-variationp Vphof an output voltage due to Iph. The micro-variation pvph is amplified by an amplifier 27 and converted into a digital signal by an A-D converter 28 then outputted to a computer 26.

Generating Process of An OBIC or Photo Excitation Current Iph

The generating process of Iph will be described next with reference to an inverter circuit. FIGS. 14 and 16 are diagrams of inverter circuits (described later), each of which shows exactly opposite of the logic and cross sectional structures of which are shown in FIGS. 15A, 15B and 17A, 17B.

These cross sectional structures show an n-type impurity region 31 for forming a p-channel transistor region on a p-type semiconductor substrate 30 and an n-channel transistor region formed in an impurity region which is the same conductive type as the substrate. The p-channel transistor region has a p-type impurity region 32s as a source electrode on the n-type impurity region 31 and an n-type impurity region 33 as a VDD clamping electrode for clamping the n-type impurity region 31 and a p-type impurity region 32d as a drain electrode at a high potential.

The n-channel transistor region also has an n-type impurity region 34s as a source electrode on an impurity region which is the same conductive type as substrate, an n-type impurity region 34d as a drain electrode, and a p-type impurity region 35 as a GND clamping electrode for clamping the substrate to a low potential. The wiring structure is shown diagrammatically in the drawings. An input wiring 36 of the inverter circuit is connected to both the gate electrodes of the p-channel and n-channel transistor regions, and an output wiring 37 of the inverter circuit is connected to the drain electrode 32d of the p-channel transistor region and to the drain electrode 34d of the n-channel transistor region. A VDD source wiring is also connected to the source electrode 32s of the p-channel transistor region and to the n-type impurity region 33 as a VDD clamping electrode, and a GND source wiring is connected to the source electrode 34s of the n-channel transistor region and to the p-type impurity region 35 as GND clamping electrode.

FIG. 14 shows a mode to be outputted with a low level signal when applying a high level signal to the input of the inverter circuit. Such mode indicates that the p-channel transistor region is in an off-state while the n-channel transistor region is an on-state. Iph can be obtained by irradiating the laser beam on the depletion layers of the drain electrodes of the p-channel and n-channel transistor regions. FIG. 15A shows a state of logical decision in irradiating the laser beam on the pn junction portion forming the drain electrode 32d of the p-channel transistor region. When a pn junction portion is irradiated with the laser beam, an electron-hole pair is generated therefrom in which the electron flows into the VDD clamping electrode 33 which clamps the p-channel transistor region while the hole flows into the GND from the n-channel transistor region through the output wiring 37. Thus, an increase of a micro-photo excitation current Iph can be seen at a power source terminal of the LSI. FIG. 15B shows a state of logical decision under the same condition as described above in irradiating the laser beam on the pn junction portion forming the drain electrode 34d of the n-channel transistor region. The electron of the generated electron-hole pair flows in the direction of GND from the n-channel transistor region while the hole thereof flows into the GND clamping electrode 35 which clamps the n-channel transistor region. Thus, since the electron-hole pair is recombined, the photo excitation current Iph does not flow.

FIG. 16 shows a mode for outputting a high level signal from the inverter circuit when applying a low level signal to the circuit. Such a mode indicates that the n-channel transistor region is off-state while the p-channel transistor region is in an off-state FIG. 17A shows a state of logical decision in irradiating the laser beam on the pn junction portion forming the drain electrode 32d of the p-channel transistor region. The electron of the generated electron-hole pair by irradiating the laser beam flows into the VDD clamping electrode 33 and the hole thereof also flows in the direction of VDD clamping electrode 33. Thus, since the electron-hole pair recombined, the photo excitation current Iph does not flow.

FIG. 17B shows a state of logical decision in irradiating the laser beam on the pn junction forming the drain electrode 34d of the n-channel transistor region. Referring to FIG. 17B, the electron of the generated electron-hole pair flows in the direction of VDD clamping electrode 33 from the p-channel transistor region while the hole of generated thereof flows into the GND clamping electrode 35 clamping the n-channel transistor region. Thus, the photo excitation current Iph flows into the power source terminal of LSI.

As described above, with the irradiation of a laser beam on the depletion layer of the drain electrode of the CMOS inverter circuit, a logic signal outputted from the n-channel or p-channel transistor region can be detected in a non-contact manner on the circuit.

However, the logic detecting method of the back OBIC system has drawback as follows.

Firstly, the analysis of measured data is complicated. That is, an outputting logic can be detected in a non-contact manner on the circuit by irradiating the laser beam on the depletion layer of drain electrodes of a pattern layout in the CMOS circuit, but the presence or absence of generating the photo excitation current Iph for deciding its resultant logic state is opposite depending on the irradiation position. As is apparent from the inverter circuit described above, at a time of outputting a low level signal, the photo excitation current Iph is generated when irradiating the laser beam on the depletion layer of the drain electrode of the p-channel transistor region while it is not generated when irradiating the laser beam on the depletion layer of drain electrode of the n-channel transistor region. In addition, at a time of outputting a high level signal, the photo excitation current Iph is not generated when irradiating the laser beam on the depletion layer of drain electrode of the p-channel transistor region but it is generated when irradiating the laser beam on the depletion layer of drain electrode of the n-channel transistor region. Therefore, the presence and absence of photo excitation current Iph should be tested and the logical decision should be carried out while a laser irradiation point is indicating which drain electrode of the transistor regions is being irradiated or whether the drain electrode of the p-channel transistor region or the electrode of the n-channel transistor region is being irradiated in collecting numerous readings of logical information, causing disorder and decision error.

Secondly, malfunction may occur. In the case where the laser beam is irradiated on the depletion layer of drain electrode of the p-channel transistor region formed on a p-type semiconductor substrate. FIGS. 15A and 15B are sectional views of LSIs for describing the principle. The p-channel transistor region has the n-type impurity region 31 on the p-type semiconductor substrate 30 in which the source electrode 32s and the drain electrode 32d are formed. The laser beam is penetrated into the n-type impurity region 31 to reached the drain electrode when irradiating the laser beam on the depletion layer of the drain electrode 32d, but at this time, the electron-hole pair is generated at the pn junction portion forming the n-type impurity region 31. The electron of the electron-hole pair therefore flows in the direction of VDD from the VDD clamping electrode 33 clamping the n-type impurity region 31 in a VDD potential and the hole thereof flows into the GND from the GND clamping electrode 35 clamping the p-type semiconductor substrate 30 in a GND potential. Thus, the photo excitation current Iph is generated regardless of the internal logic of the circuit, causing errors which cannot be detected by a logical decision.

Moreover, the semiconductor device region becomes small in response to the work in process in making the multi-layered interconnections and micro-structures in the development of the LSI, particularly the work in process of the micro-structures. It is also difficult to irradiate the laser beam on a specifically targeted point since the distance adjacent devices becomes small.

SUMMARY OF THE INVENTION

It is therefore an object of the present invention to provide a semiconductor integrated circuit having a logic verifying structure capable of readily detecting internal logical states in a non-contact manner on a CMOS LSI by irradiating a laser beam used with the back OBIC system on the back of a semiconductor substrate without causing error, and a method of manufacturing the semiconductor integrated circuit having a logic verifying structure.

According to a first aspect of the present invention, there is provided a semiconductor integrated circuit having an impurity region irradiated by a laser beam on the back of a semiconductor substrate for testing a logic circuit.

The impurity region includes a conductive type different from that of the semiconductor substrate, and electronically independent from a source voltage clamping region and a semiconductor device region constituting a logic circuit.

The impurity region is aligned and arranged on a certain area of the semiconductor substrate, and may be connected to each output portion of the test circuits through a pattern wiring, as required to test the logic circuit.

The impurity region is connected to the pattern wiring through contact holes provided on the impurity region, as required, and desirably coated by the pattern wiring in the case of connecting to the pattern wiring through the contact holes.

The impurity region may be aligned and arranged with a pitch similar to that of the pattern wiring of the semiconductor substrate.

The pattern wiring either makes up of an electronic circuit or makes independent from the electronic circuit.

The pattern wiring connected to the impurity region through the contact holes is connected to the pattern wiring intersecting the signal pattern wiring present thereon by the laser welding, as required.

According to a second aspect of the present invention, there is provided a method of manufacturing a semiconductor integrated circuit for verifying a logic of the circuit, comprising the steps of: providing a semiconductor substrate having a predetermined conductive type; forming an impurity region on the semiconductor substrate; forming an insulation film on the semiconductor substrate and the impurity region; forming a contact on the impurity region by opening the insulation film; forming a pattern wiring on the insulation film and the contact; and forming a signal pattern wiring above the pattern wiring, a part of which is overlapped with the signal pattern wiring.

According to the construction of the semiconductor integrated circuit and the method of manufacturing of the same described above, the impurity region as a logic detecting pattern is formed on the semiconductor substrate by the back OBIC system and the logic detecting pattern is irradiated by the laser beam to thereby identify a logic by stating that the pattern is conducted with the signal pattern wiring. Therefore, the following features will be raised.

Firstly, a simple logic analysis can be achieved. That is, since the detecting system of the present invention depends on output wiring logic in which the photo excitation current Iph is generated by the case where a logic is the high level signal by laser beam irradiation while it is not generated by the case where a logic is the low level signal by the recombination of excitation carrier with the laser beam irradiated, the logic can be decided by the presence and absence of the photo excitation current Iph.

Secondly, the logic analysis of the present invention can be prevented from malfunction caused by the back OBIC system. Since the technology of LSI will be developed in high speed and high performance in the future, there would be utilized a multi-layered structure of an epitaxial layer, a pn junction layer and the like for a system for realizing such development. The error of logical decision can be eliminated by the back OBIC method of the present invention when deciding logic verification of the multi-layered structure.

Thirdly, the logic analysis can be carried out without sustaining affection from the critical dimension of LSI regardless of the development since the laser beam is simply irradiated on the logic detecting pattern, even though the semiconductor device region becomes small and distance adjacent to the device becomes also small by the development of making LSI into a multi-layered wiring structure and its critical dimension. In addition, since the logic detecting pattern is only required to have a minimum size depending on a width of wiring, there is no waste against the size of LSI chip.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Hereinafter, embodiments of the present invention will be described with reference to the drawings.

First, a basic pattern layout structure of the present invention will be described, a detecting principle of a photo excitation current Iph by the back OBIC system will be described next, an application of the pattern layout of an LSI will then be described with three examples, and finally a manner for enhancing the pattern layout in response to making into large-scale of an LSI will be described.

Explanation of The Pattern Layout Structure

Figure 1:
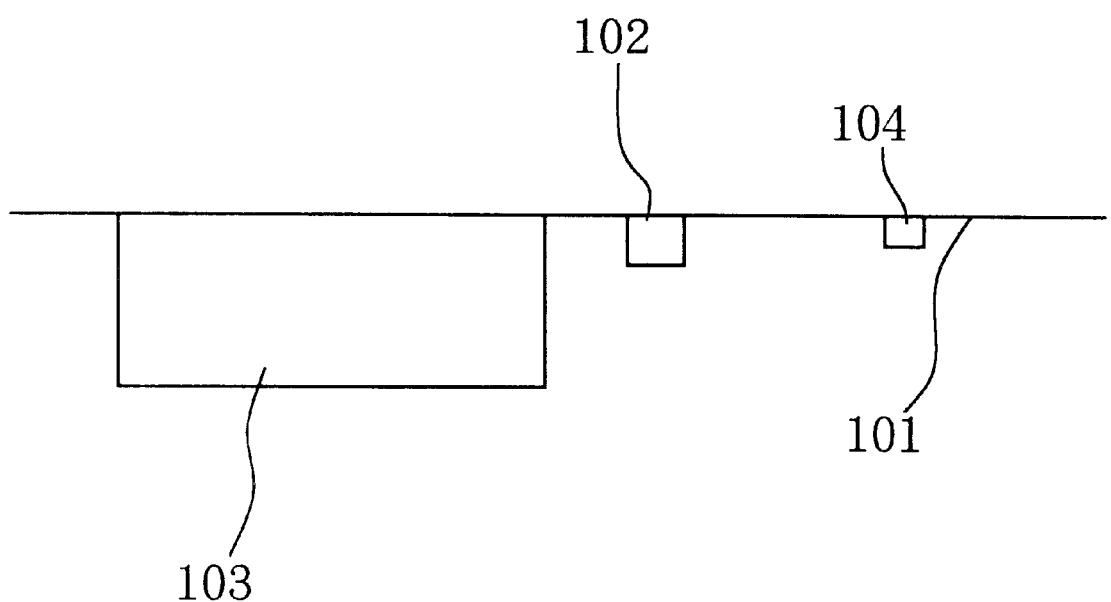
FIG. 1 is a sectional view showing a basic pattern layout of the semiconductor integrated circuit having a logic verifying structure in the present invention.

FIG. 1 is a sectional view showing a basic pattern layout for a logic verification of the present invention. A p-type semiconductor substrate 101 has a source voltage clamping region 102 having a substrate potential and an n-type impurity region 104 electronically independent from a semiconductor device forming region 103 which constitutes an internal logic circuit thereon. There is no pn junction layer up to the back of the semiconductor substrate 101 under the n-type impurity region 104.

Figure 2A:
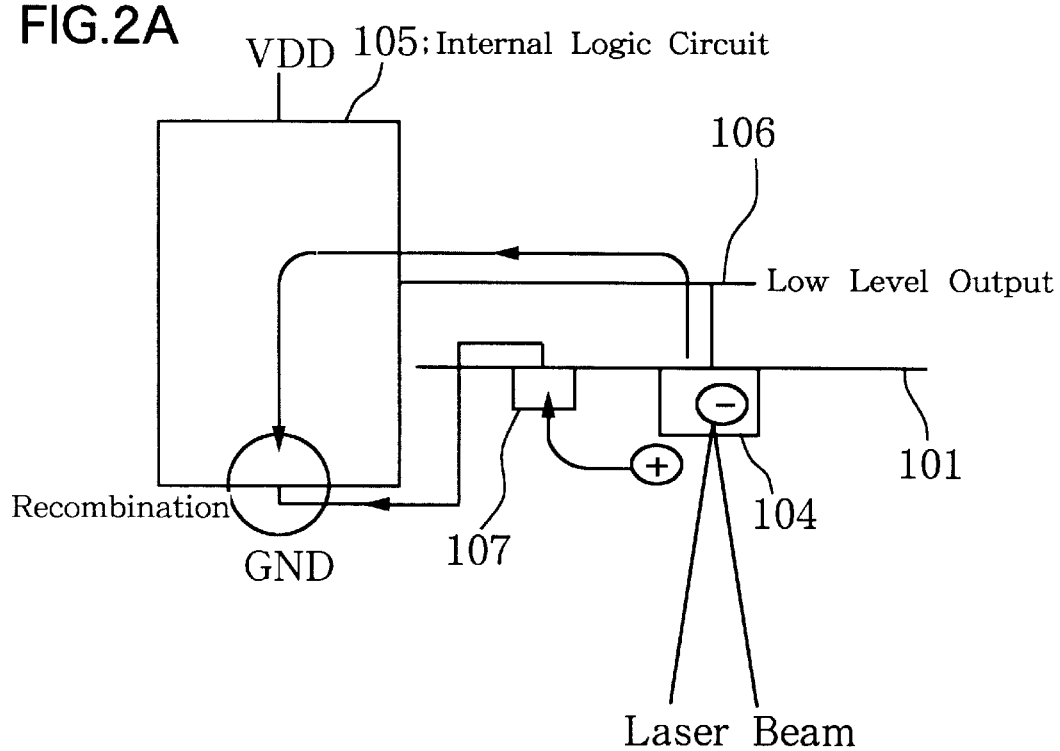
FIG. 2A is an explanatory diagram for explaining a logic detection by the back OBIC system when outputting a low level signal at an output terminal of internal logic circuit.
Figure 2B:
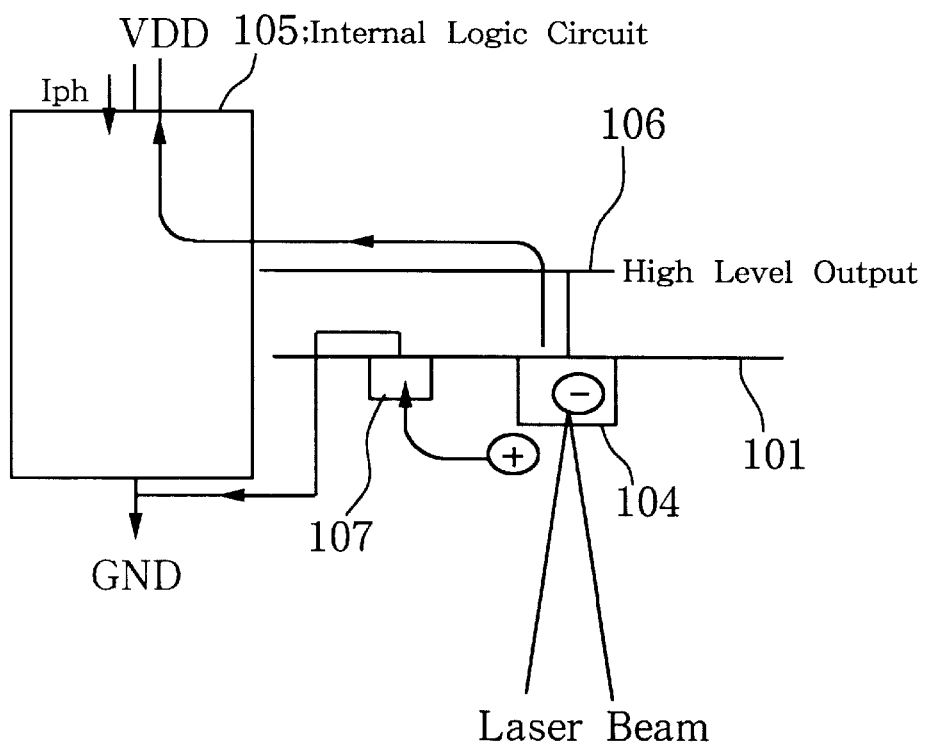
FIG. 2B is an explanatory diagram for explaining a logic detection by the back OBIC system when outputting a high level signal at the output terminal of internal logic circuit.

The n-type impurity region 104 described above is used for detecting an output logic of internal logic circuits in an LSI by the back OBIC system. FIGS. 2A and 2B show circuit diagrams for detecting its logic. An output wiring 106 of respective internal logic circuits 105 making up of the LSI is connected to the electronically independent n-type impurity region 104.

Explanation of Detecting Principle of The Photo Excitation Current Iph by The Back OBIC System FIG. 2A is an explanatory diagram for a logic detection by the back OBIC system when a low level signal is outputted from an output terminal of a CMOS-type internal logic circuit. When an electron-hole pair is generated at the depletion layer of the n-type impurity region 104 by irradiating a laser beam due to the low level signal outputted from the internal logic circuits 105, the electron flows into a GND terminal through the output wiring 106 since the output of internal logic circuit is conducted to the GND terminal due to the low level signal. While the hole flows into the GND terminal from a GND clamping electrode, 107 which clamps the semiconductor substrate 101 in the minimum potential. Thus, the photo excitation current Iph is not generated due to recombination of the electron and hole at the GND terminal.

FIG. 2B is an explanatory diagram for the logic detection by the back OBIC system when a high level signal is outputted from the output terminal of CMOS-type internal logic circuit.

When the electron-hole pair is generated at the depletion layer of the n-type impurity region 104 by irradiating the laser beam due to a high level signal outputted from the internal logic circuit 105, the electron flows in the direction of a VDD voltage source through the output wiring 106 since the output of internal logic circuit is high level signal and conducted to the VDD voltage source. While the hole flows into the GND terminal from the GND clamping electrode 107 which clamps the semiconductor substrate 101 in the minimum potential. Thus, the photo excitation current Iph is generated due to the electron and hole flown into the opposite electrodes each other.

Such logic detection system only depends on logic of the output wiring 106, and if the logic is a low level signal, the photo excitation current Iph is not generated since the excitation carriers due to the irradiation of laser beam are recombined, and if the logic is a high level signal, the photo excitation current Iph is generated since the excitation carriers flow thereinto each other.

Application to A Pattern Layout of LSI

Three application examples to the pattern layout of LSI using the structure described above will be described below.

Figure 3A:
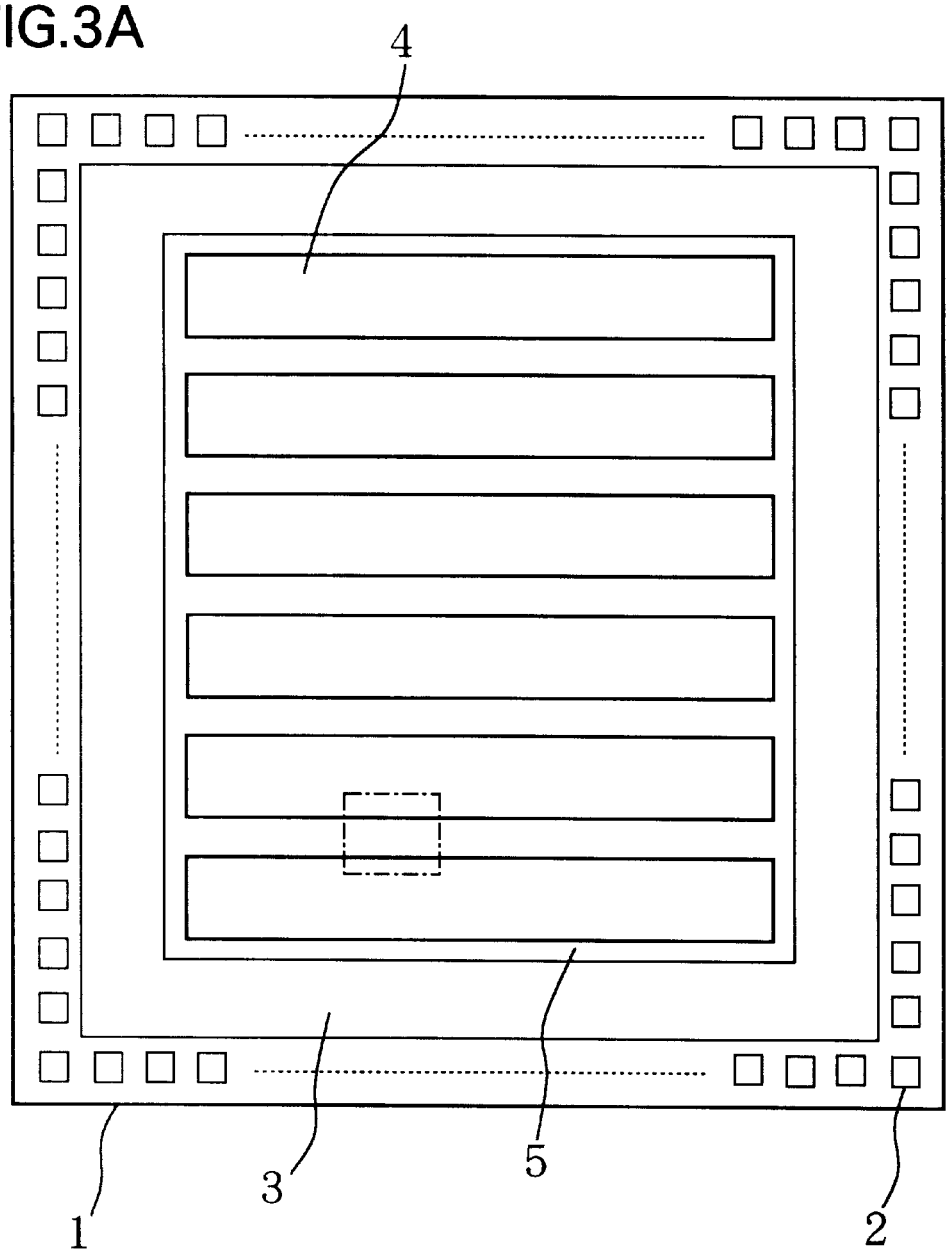
FIG. 3A is a plan view roughly showing a CMOS gate array typically used for an ASIC (Application Specific Integrated Circuits) in a first embodiment of the present invention.

FIG. 3A is a plan view roughly showing a CMOS gate array typically used for ASIC (Application Specific Integrated Circuits) in a first embodiment of the present invention.

Figure 3B:
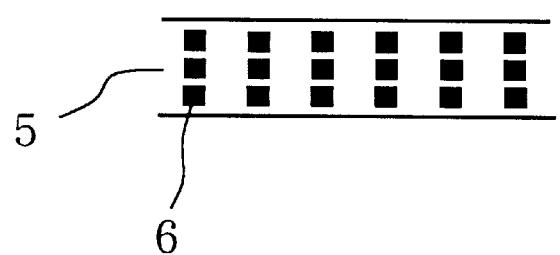
FIG. 3B is an enlarged view of indicating a portion enclosed by chain line on FIG. 3A in which an n-type impurity region is provided so as to match with a pitch of pattern wiring in wiring channel region.

Referring to FIG. 3A, an input and output circuit portion 3 is arranged inside bonding pad portions 2 arranged around the outer portion of a semiconductor chip 1 in which an internal logic circuit portion is incorporated. The internal logic circuit portion is comprised of cell group regions 4 having a group of devices, as a basic unit, referred to as a "cell" made up of a basic logic circuit is arranged with an array-liked layout, and wiring channel regions 5 (or pattern wiring regions) standardized and provided for connecting the basic logic circuits to each other, and connecting the basic logic circuits with the input and output circuit portion 3. Some n-type impurity regions 6 (showing in FIG. 3B) as an electronically independent photo excitation current Iph detecting patterns are then provided so that the wiring channel regions 5 are matched with a wiring channel pitch. FIG. 3B is an enlarged view of a portion enclosed by chain line in FIG. 3A, and the electronically independent n-type impurity regions 6 are provided so that the wiring channel regions 5 are matched with the wiring channel pitch.

Figure 4:
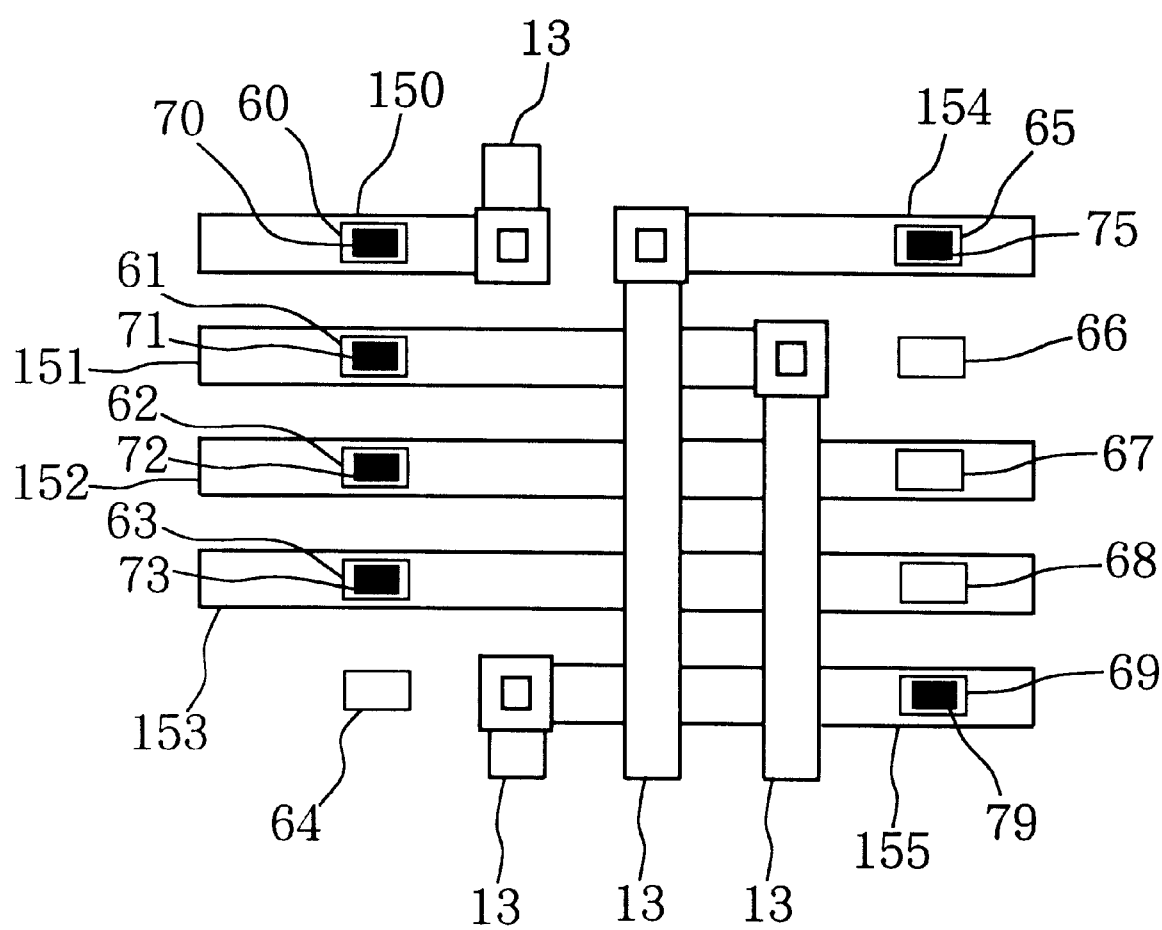
FIG. 4 is a plan view showing a specifically laid-out CMOS gate array in accordance with FIG. 3A.

FIG. 4 is a specific layout showing the gate array of FIGS. 3A and 3B. Refer ring to FIG. 4, n-type impurity regions 60 to 69 as photo excitation current Iph detecting patterns are arranged with an equal interval which is the same pitch as the wiring channel pitch (pattern wiring pitch). Wiring 150 to 155 are arranged with the photo excitation current Iph detecting patterns (hereinafter, referring to as Iph detecting patterns) 60, 61, 62, 63, 65 and 69 coated by the wiring . It should be noted that the arrangement of wiring 152 is shown in FIG. 4. The n-type impurity region 62 as an Iph detecting pattern is electrically connected to the wiring 152 through a contact 72, but not to the n-type impurity region 67 which is another Iph detecting pattern. This is because the wiring is the same to thereby measure one of two wiring and also prevent the wiring from adding an extra capacitance. Such a manner for only opening a hole for an arbitrary Iph detecting pattern is apparent from a well-known gate array component manufacturing process. That is, since a desirable electronic circuit is manufactured by connection between basic logic circuit blocks with use of the simulation process in case of custom-made or specifically designed products, a mask process for each product is started from a contact process and the presence and absence of a contact hole made by the contact process is determined in response to each of the products, so that there arises no problem in the process. As is apparent from FIG. 4, the n-type impurity region 60 is electrically conducted with the wiring 150 through a contract 70; the n-type impurity region 61 with the wiring 151 through a contact 71; the n-type impurity region 63 with the wiring 153 through a contact 73; the n-type impurity region 65 with the wiring 154 through a contact 75; and the n-type impurity region 69 with the wiring 155 through a contact 79. A double-layered wiring 13 will be described later.

Furthermore, since the Iph detecting patterns 64 and 66 where the wiring is not passed through are not necessary for the process, the contact hole is not required and it is apparent that the contact hole is selectively opened, as described above.

Figure 5A:
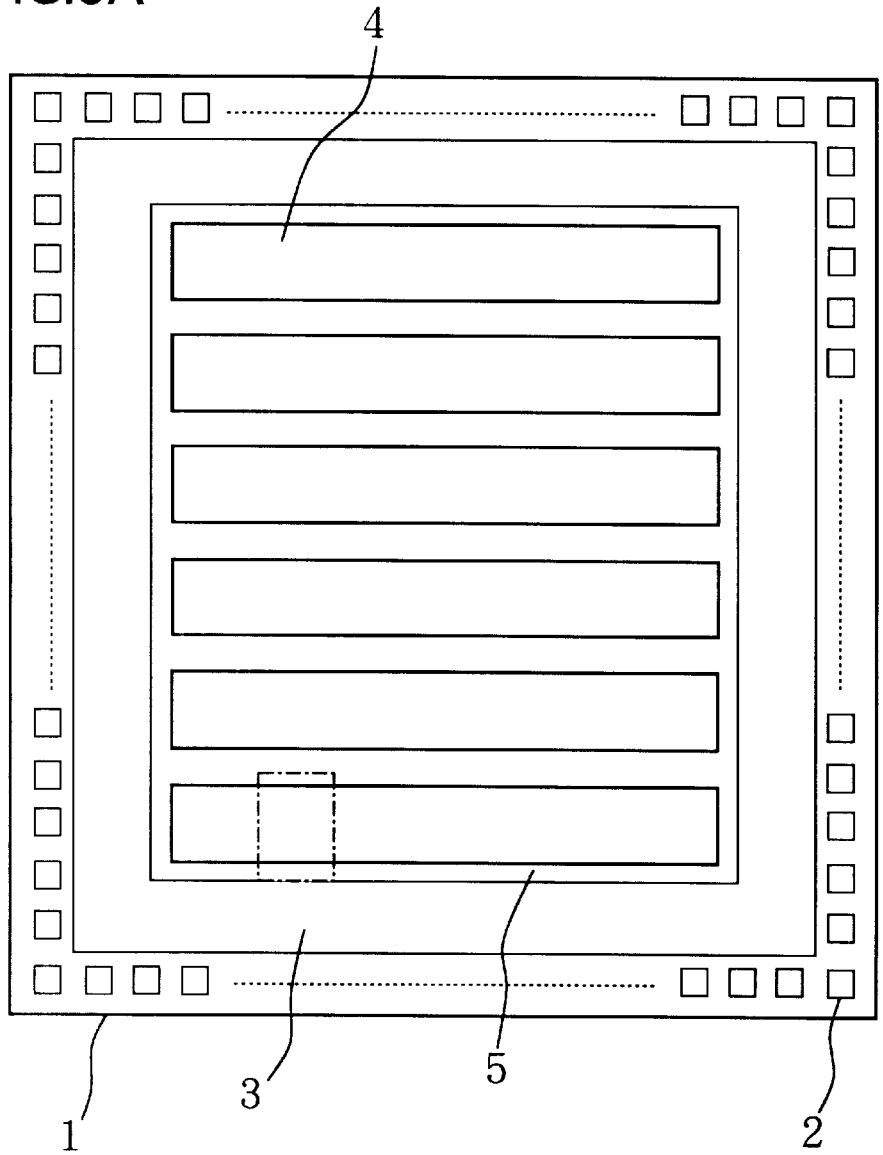
FIG. 5A is a plan view roughly showing a CMOS gate array in a second embodiment of the present invention.
Figure 5B:
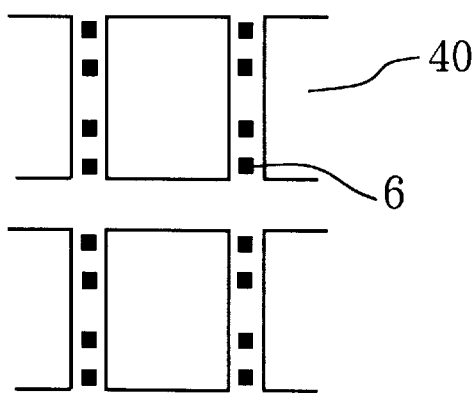
FIG. 5B is an enlarged view of indicating a cell group region portion enclosed by chain line on FIG. 5A in which an n-type impurity region is regularly arranged between the cells constituting a basic logic circuit.

FIG. 5A is a plan view roughly showing a CMOS gate array in a second embodiment of the present invention in which a semiconductor chip structure is similar to that of the first embodiment shown in FIG. 3A. FIG. 5B is a enlarged view showing a portion enclosed by chain line as an arbitrary portion of the cell group region 4 in which the n-type impurity regions 6 as Iph detecting patterns are dispersedly but regularly arranged between semiconductor device forming region 40 comprising a basic logic circuit. Referring to FIG. 5B, the n-type impurity regions 6 as an electronically independent Iph detecting pattern from the semiconductor device forming region 40 referred to as "cell" are provided inside the cell group regions 4. This arrangement makes a logic verification outputted from each of the basic logic circuits and an internal verification of the circuit forming the basic logic easy.

Figure 6A:
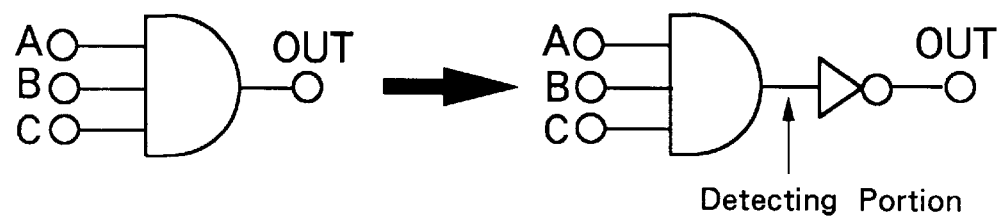
FIG. 6A is circuit diagrams showing three-input AND circuits.

FIG. 6A is a diagram showing a three-input AND circuit which is used for explaining an example of internal logic verification in the CMOS LSI shown in FIGS. 5A and 5B. In general, since an AND circuit is represented by adding inverter circuits to the input ends of a NAND circuit, it is ensured that both the output logic of the NAND circuit and inverter circuits are verified in case of verifying the internal logic of AND circuit.

Figure 6B:
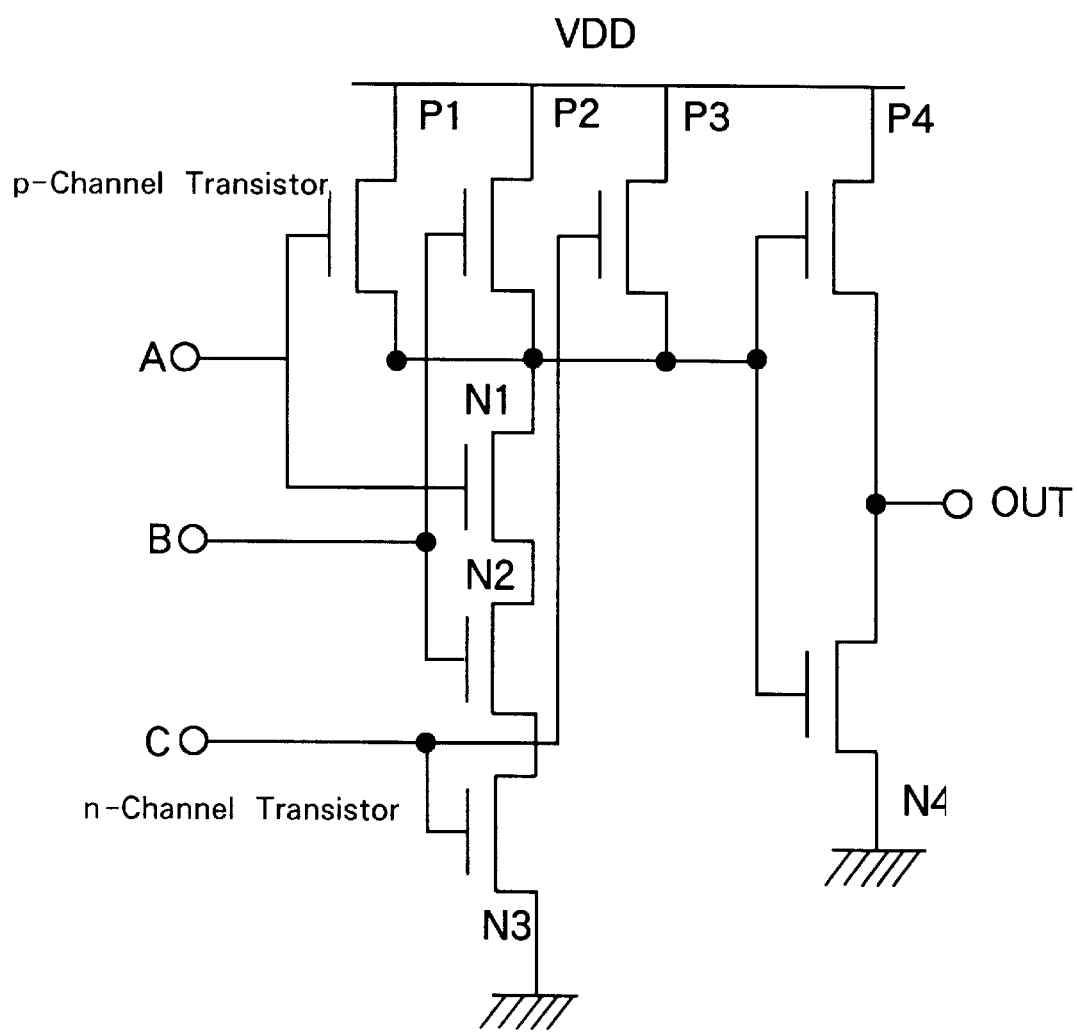
FIG. 6B is a transistor circuit diagram showing three-input AND circuit.
Figure 7:
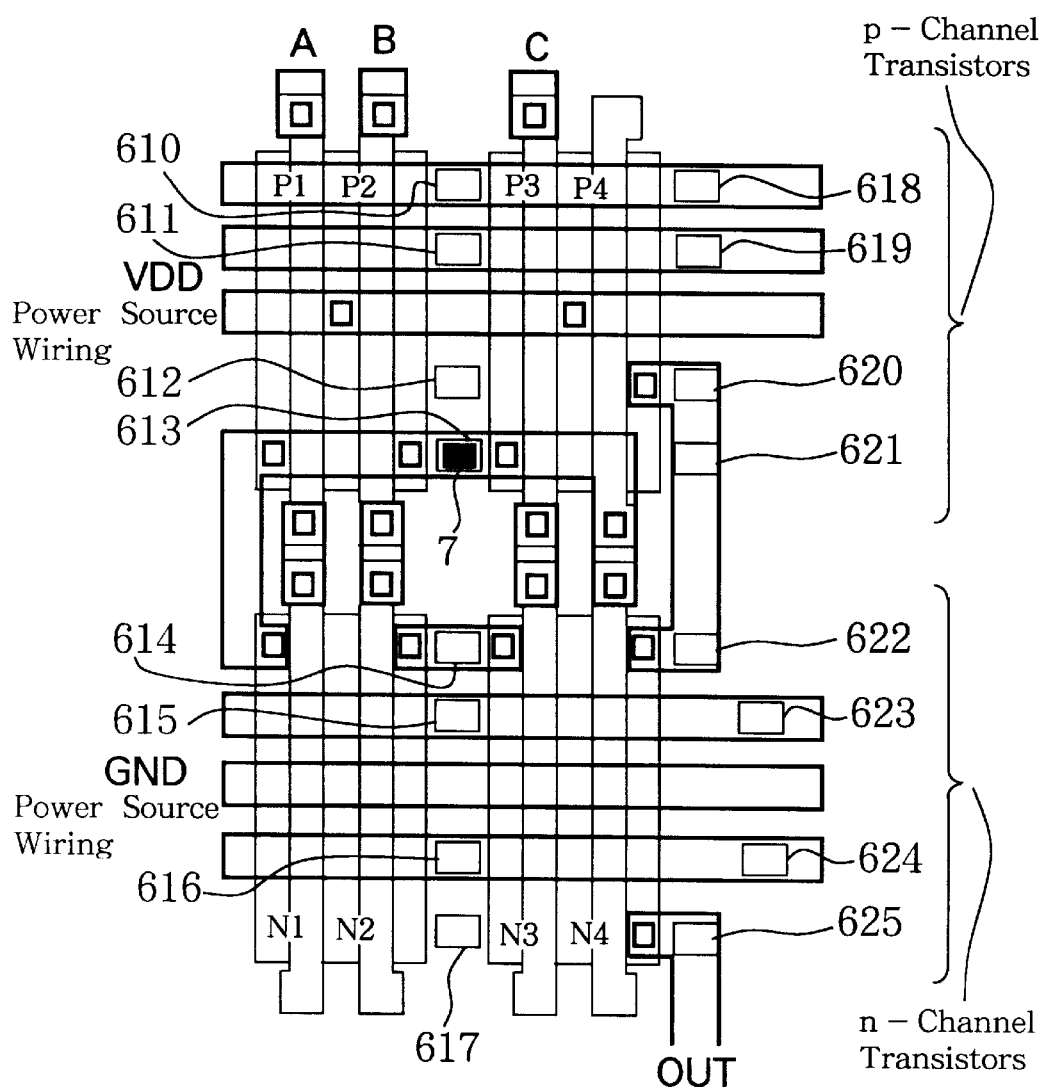
FIG. 7 is a diagram showing a pattern layout in accordance with the three-input AND circuit shown in FIGS. 6A and 6B.

FIG. 6B is a diagram showing the transistors of three-input AND circuit in which those are comprised of four p-channel transistors P1, P2, P3 and P4, and four n-channel transistors N1, N2, N3 and N4. This diagram also shows apattern layout having a three-input AND circuit, and also, as one cell having a group of transistors represents a two-input NAND circuit, therefore, there are totally two cells shown in FIG. 6B. FIG. 7 is a layout showing the gate array of FIGS. 6A and 6B and reference symbols of the transistors in these drawings indicate in common. Referring to FIG. 7, contacts can be arranged arbitrarily on n-type impurity regions 610 to 625 as Iph detecting patterns similar to the first embodiment.

In the second embodiment, since a contact is only required for an output wiring of a three-input NAND circuit in this case, a contact 7 is arranged on an Iph detecting pattern 613 for verifying a logic.

Figure 8A:
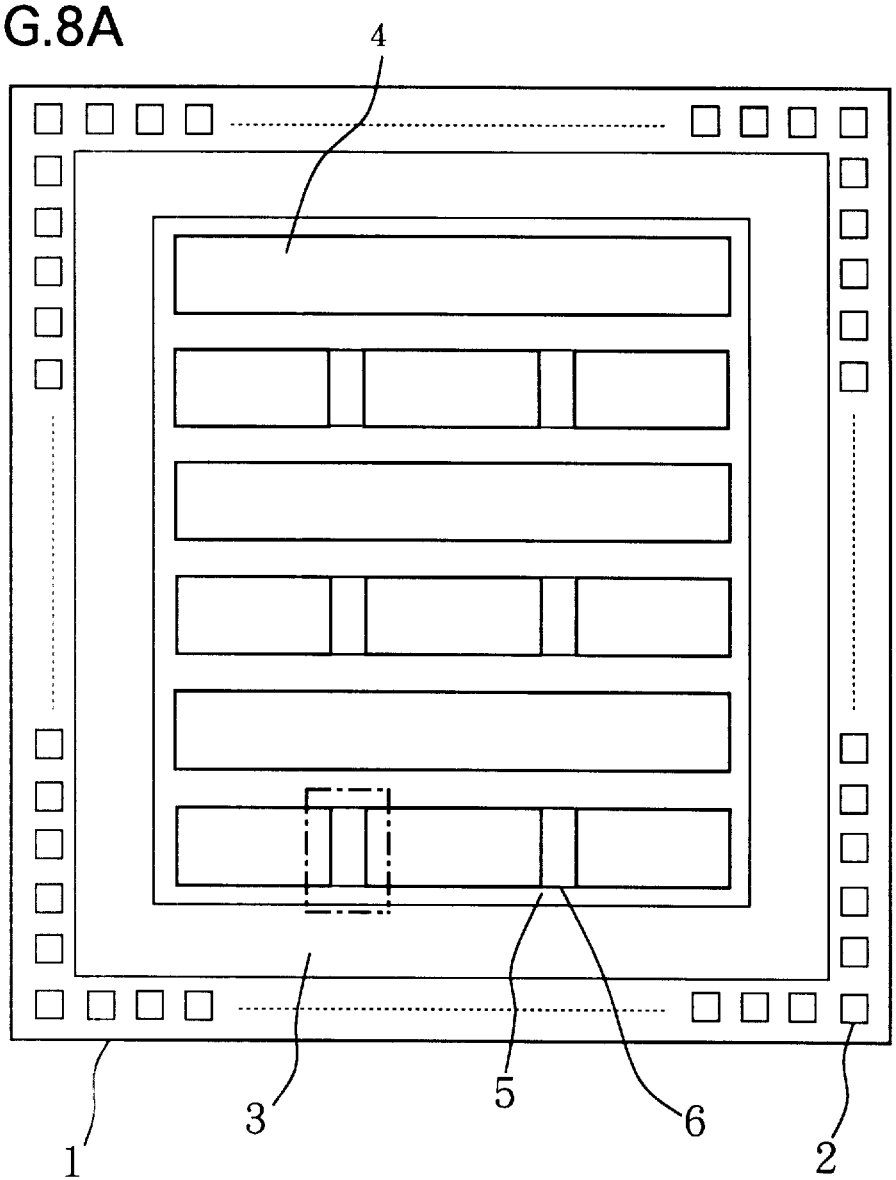
FIG. 8A is a plan view roughly showing an applicable example to a specifically used product in a third embodiment of the present invention.
Figure 8B:
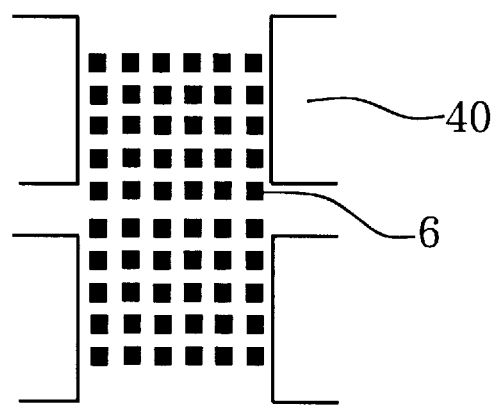
FIG. 8B is an enlarged view showing a portion enclosed by chain line on FIG. 7A in which an n-type impurity region is integratedly arranged on a certain portion of LSI in an array-liked layout.

FIG. 8A is a plan view showing applicable example to a specifically designed product of a third embodiment in the present invention in which an n-type impurity region 6 as an Iph detecting pattern is arranged on an arbitrary position of an LSI with array-liked arrangement. Other construction elements with reference numerals in FIG. 8A are used in FIG. 5a which is already described above. FIG. 8B is an enlarged view of a portion enclosed by chain line in FIG. 8A and shows the Iph detecting pattern which indicates an array-liked arrangement. Wiring can be led out from the Iph detecting pattern necessary for the logical verification. As described above, the n-type impurity regions as Iph detecting patterns are regularly arranged on the LSI, realizing the laser beam irradiation by shortest scanning course.

Next, the shape of n-type impurity region as Iph detecting pattern will be described below. Previously, there was no strictly specified standard for wiring system because the delay operation of semiconductor device was large.

However, the delay problem for wiring system has specially arisen these days since the operational speed of semiconductor device is remarkably enhanced by critical dimension development. To this end, resistor and capacitor causing the delay are strictly subjected to wiring limitations.

Since semiconductor devices have been made into large-scale as well as hybrid-systems, the demand for logic verification of LSIS has been increased. Therefore, the n-type impurity region as Iph detecting pattern should have a size as small as possible and also with a simple process, and a certain idea is required to connect the n-type impurity region as Iph detecting pattern to the wiring, as required.

Figure 9:
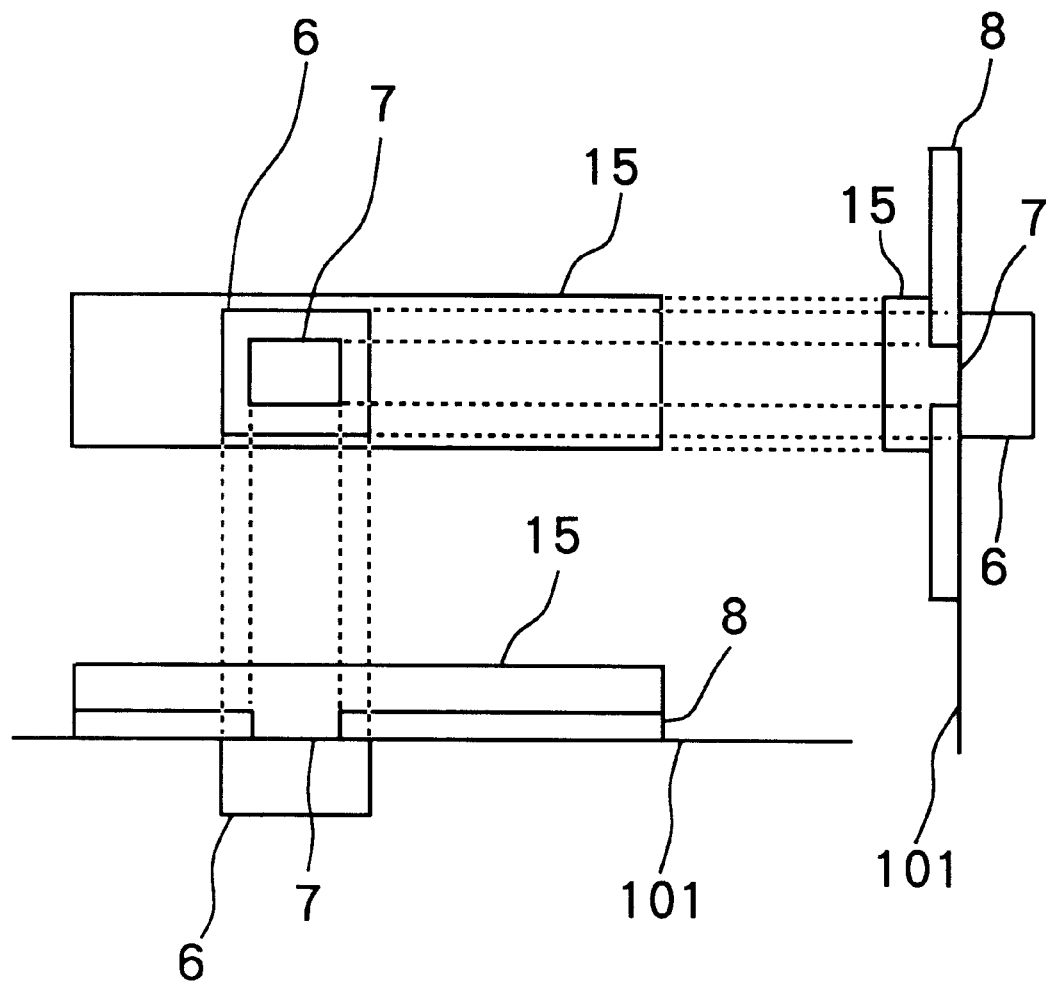
FIG. 9 is three explanatory views showing a layout adjacent to an n-type impurity region covered by wiring for detecting the minimum photo excitation current Iph.

In the minimum-sized shape of an n-type impurity region, a contact formed on a wiring should be of a smaller size than the width of the wiring. As shown in FIG. 9, the n-type impurity region 6 as an Iph detecting pattern is formed on the semiconductor substrate 101 on which an insulation film 8 is coated, and the contact 7 is formed on the n-type impurity region 6 as Iph detecting pattern such that a rectangular opening is formed through the insulation film 8. A wiring 15 is then formed on the entire area of the contact 7 and the insulation film 8. Such rectangular opening of the contact 7 is readily formed by the ion implantation, impurity diffusion or the like as a self-alignment process.

Figure 10A:
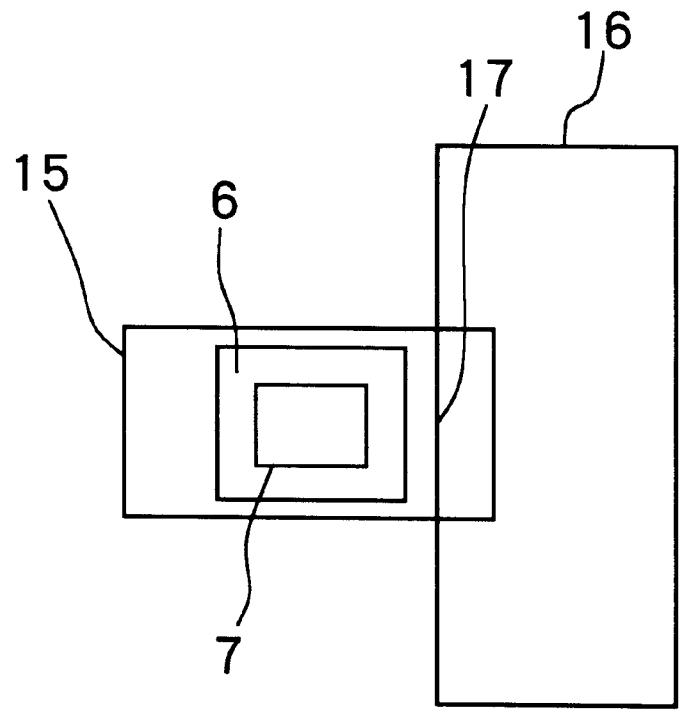
FIG. 10A is a plan view showing a layout for conducting the n-type impurity region and an upper layer wiring by a processing.
Figure 10B:
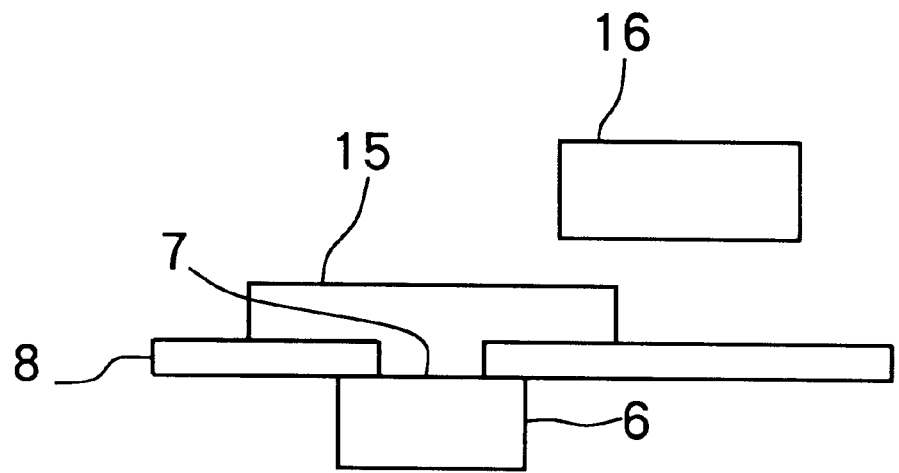
FIG. 10B is a side view showing a layout for conducting the n-type impurity region and an upper layer wiring by the processing.
Figure 11A:
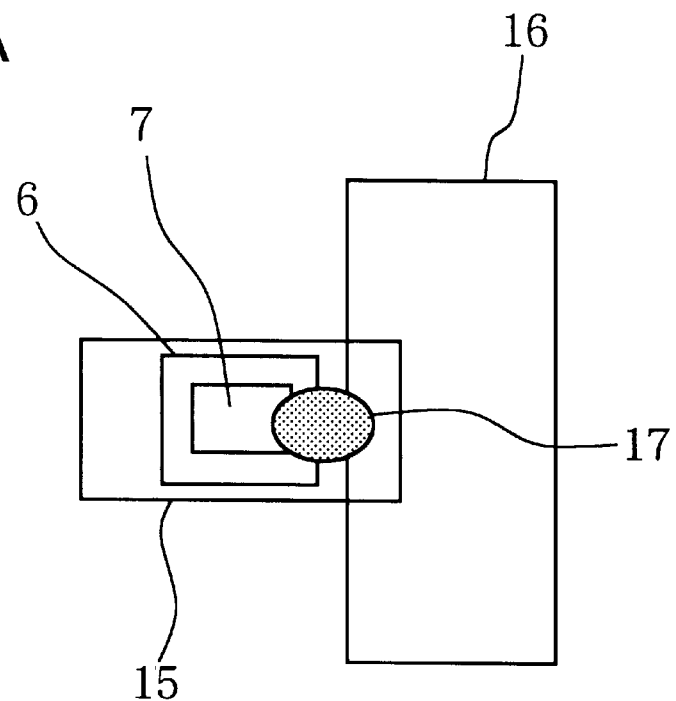
FIG. 11A is a plan view showing a layout for conducting the n-type impurity region and the upper layer wiring by a processing.
Figure 11B:
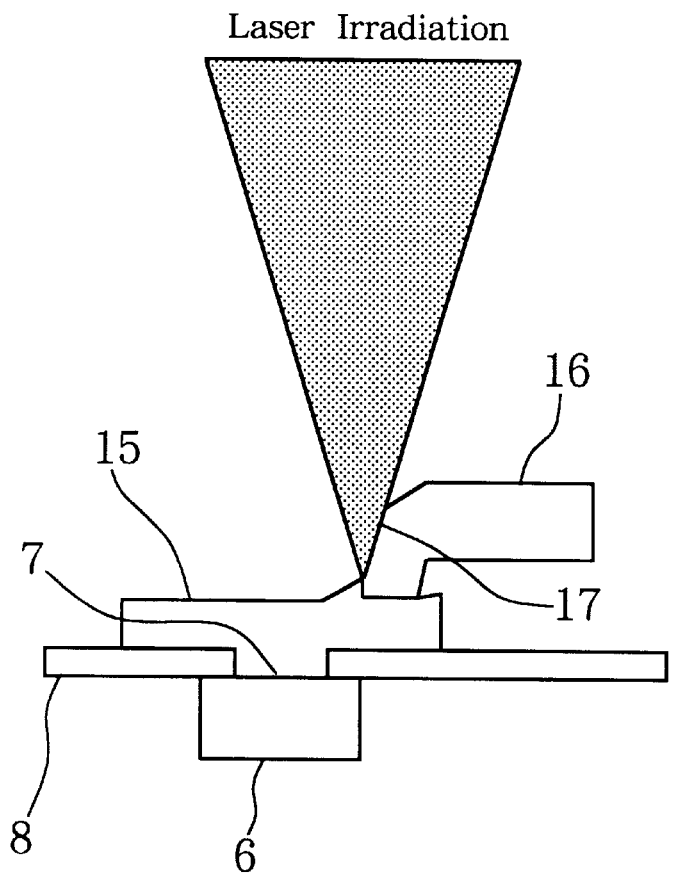
FIG. 11B is a side view showing a layout for conducting the n-type impurity region and the upper layer wiring by the processing.
Figure 12:
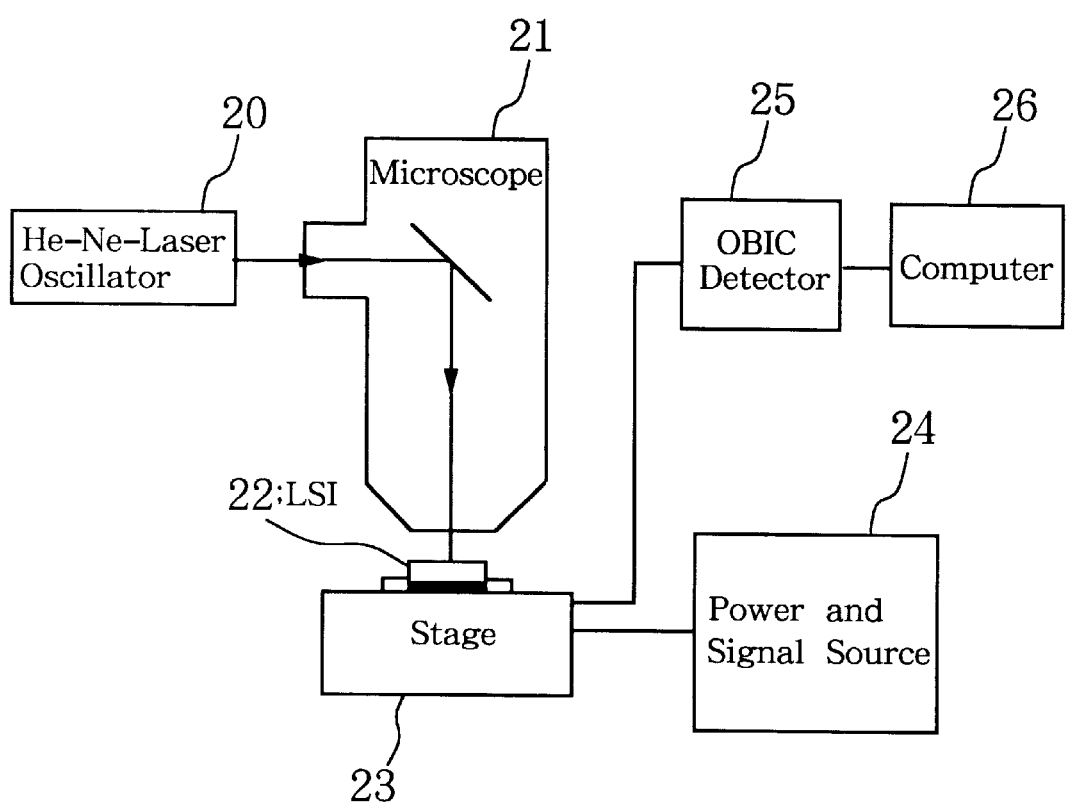
FIG. 12 is a diagram showing an OBIC detecting apparatus with use of a laser beam.
Figure 13:
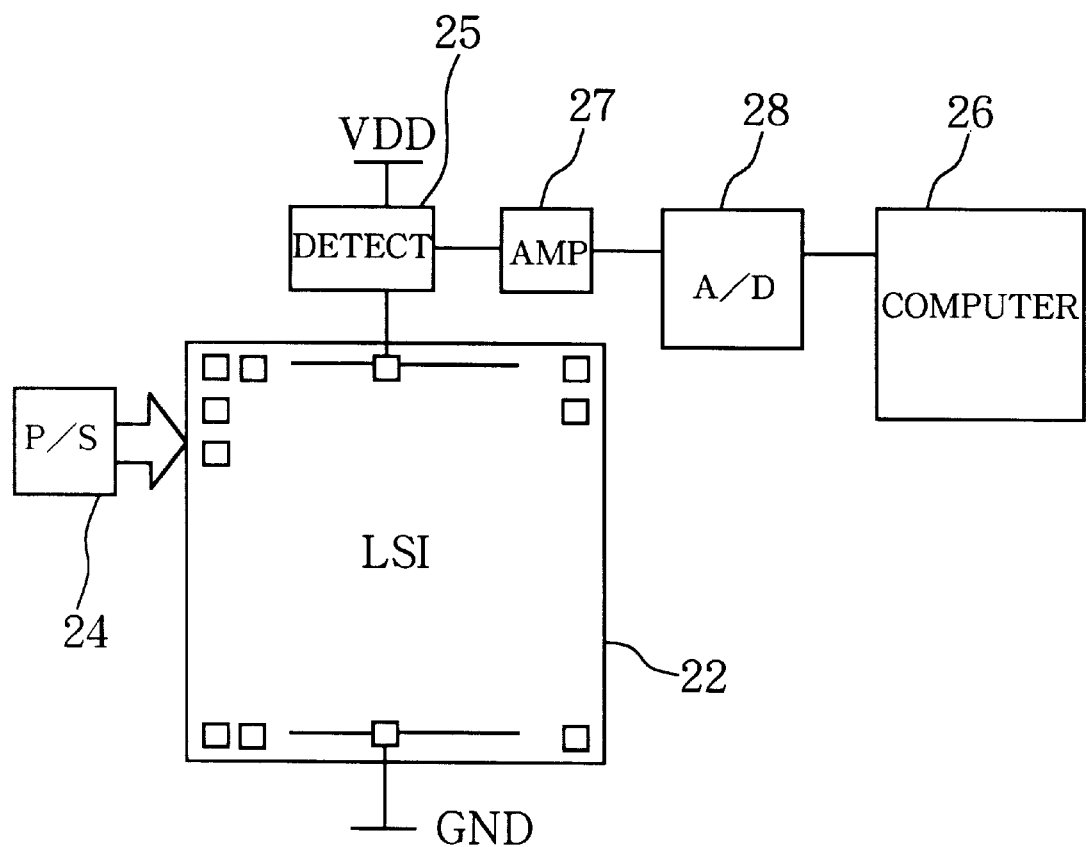
FIG. 13 is a diagram for explaining the detection of OBIC in detail.
Figure 14:
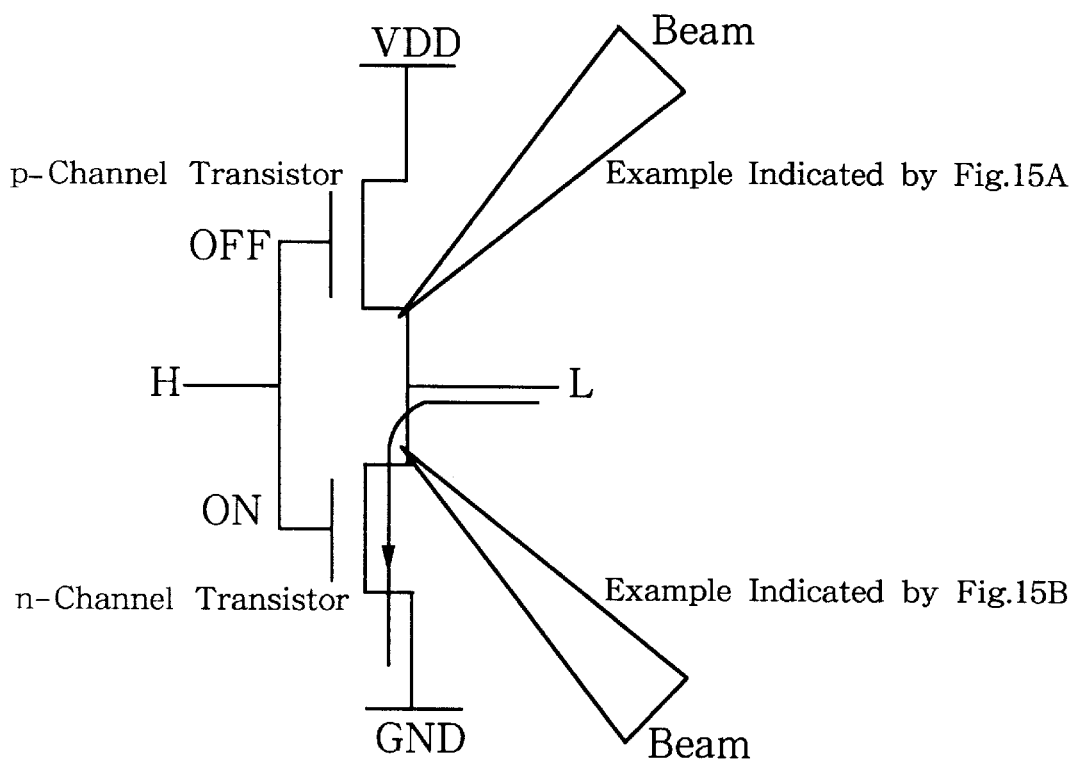
FIG. 14 is a diagram showing an inverter circuit to be outputted a low level signal when applying a high level signal to an input thereof for explaining FIGS. 15A and 15B.
Figure 15A:
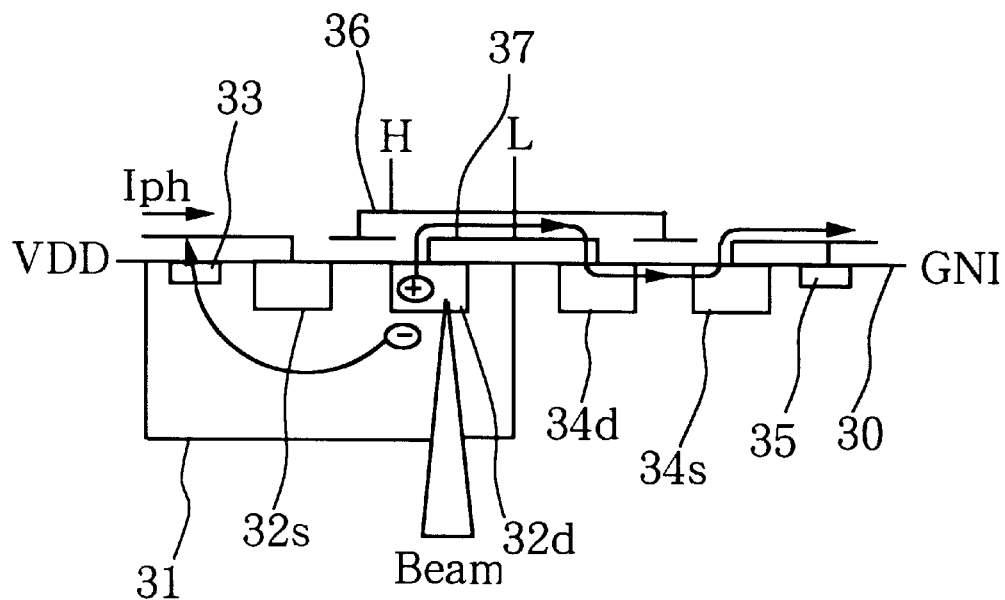
FIG. 15A is a sectional view showing the inverter circuit shown in FIG. 14 and a state of logical decision when irradiating the laser beam on a pn junction forming a drain electrode in the p-channel transistor region.
Figure 15B:
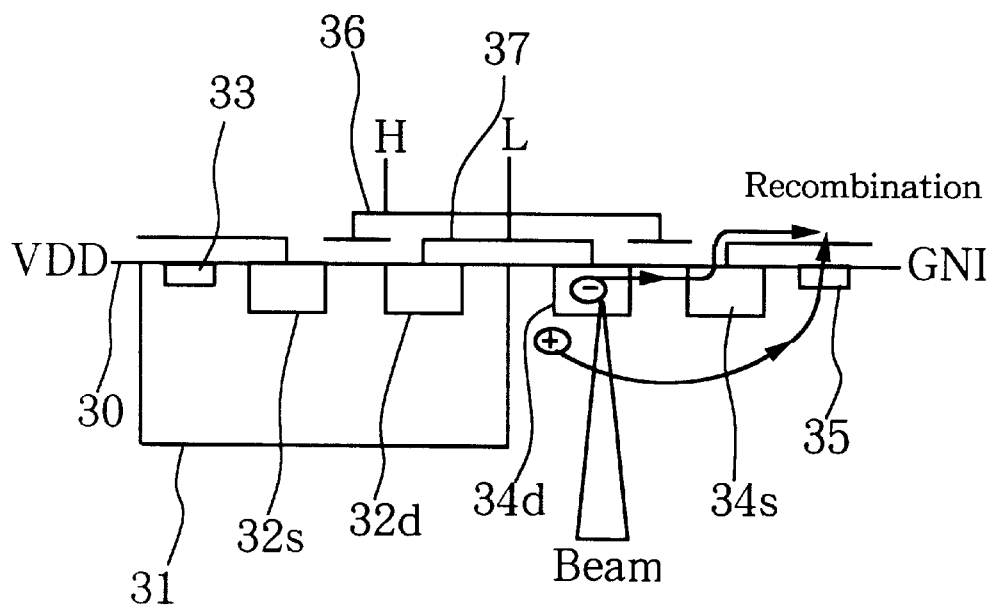
FIG. 15B is a sectional view showing the same inverter circuit and a state of logical decision when irradiating the laser beam on a pn junction forming a drain electrode in the n-channel transistor region.
Figure 16:
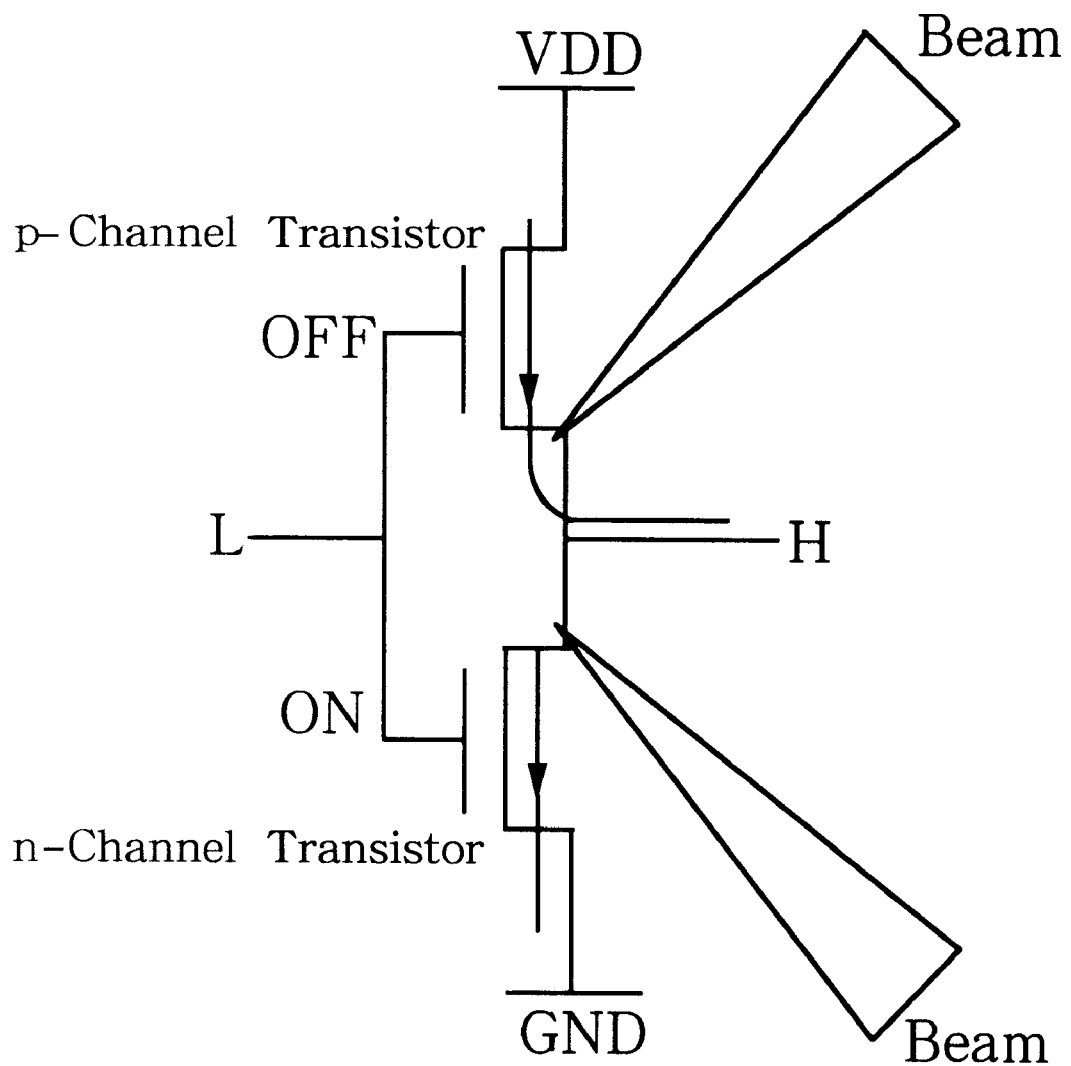
FIG. 16 is a diagram showing the inverter circuit to be outputted a high level signal when applying a low level to an input thereof for explaining FIGS. 17A and 17B.

FIGS. 10A and 10B are a plan view and a side view showing layout for conducting the wiring 15 with an arbitrary signal wiring 16 after completing the process described with FIG. 9 above, in which a part of the signal wiring 16 extended from an electronic circuit is arranged over the wiring 15 so as to be overlapped with the wiring 15. FIGS. 11A and 11B are a plan view and a side view showing a process for conducting the wiring 15 with the signal wiring 16, that is, the n-type impurity region 6 as Iph detecting pattern with the signal wiring 16. Referring to FIGS. 10A and 10B, when the logic verification is required for the signal wiring 16, a portion 17 where the wiring 15 is overlapped with the signal wiring 16 is irradiated by a laser beam to make a short circuit as shown in FIGS. 11A and 11B. Such short circuit may also be made by compression using a so called mechanical prober which is not shown by the drawing. The wiring 15 for the Iph detecting pattern may be of poly-crystal silicon type used for a CMOS circuit gate electrode in general, therefore, the upper signal wiring 16 is well fitted with the wiring 15 which is also well fitted with the wiring 13 (FIG. 4) formed on the wiring 15, so that it is possible to realize the logic verification by the process and make it easy.

Figure 17A:
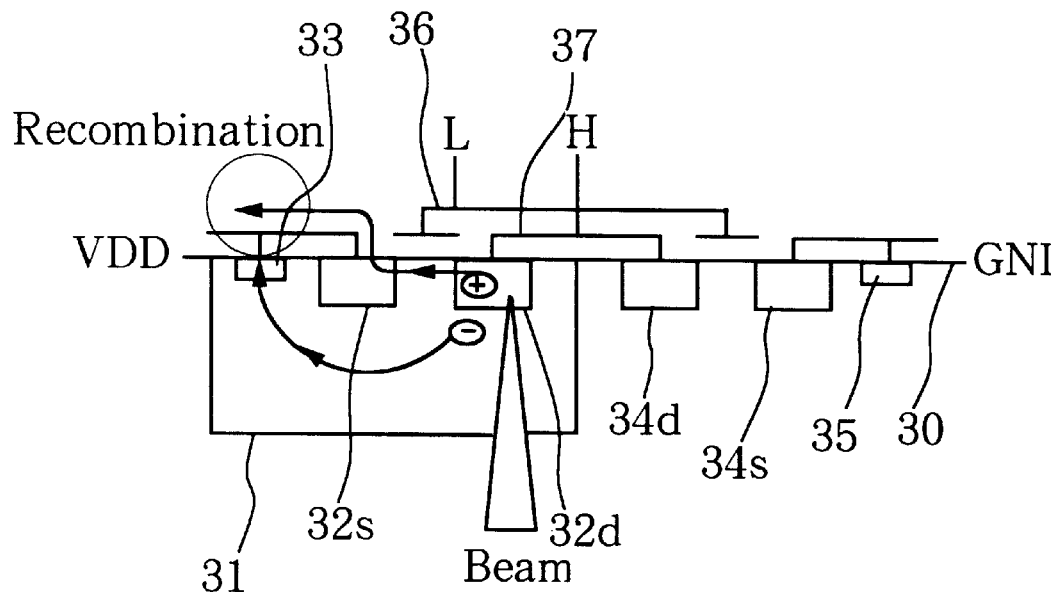
FIG. 17A is a sectional view showing the inverter circuit shown in FIG. 16 and a state of logical decision when irradiating the laser beam on a pn junction forming a drain electrode in the p-channel transistor region.
Figure 17B:
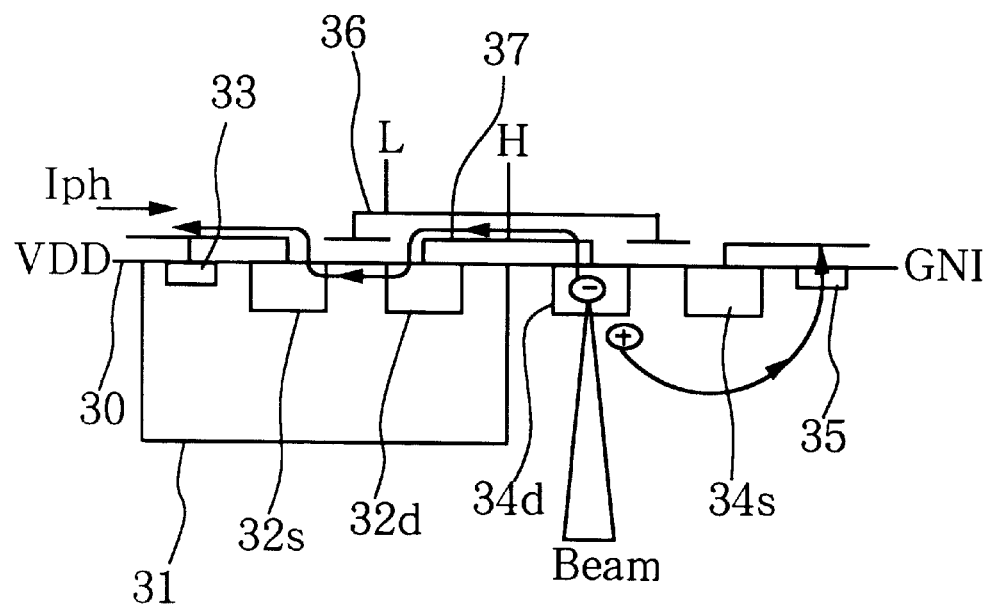
FIG. 17B is a sectional view showing the same inverter circuit and a state of logical decision when irradiating the laser beam on a pn junction forming a drain electrode of the n-channel transistor region.
Figure 18:
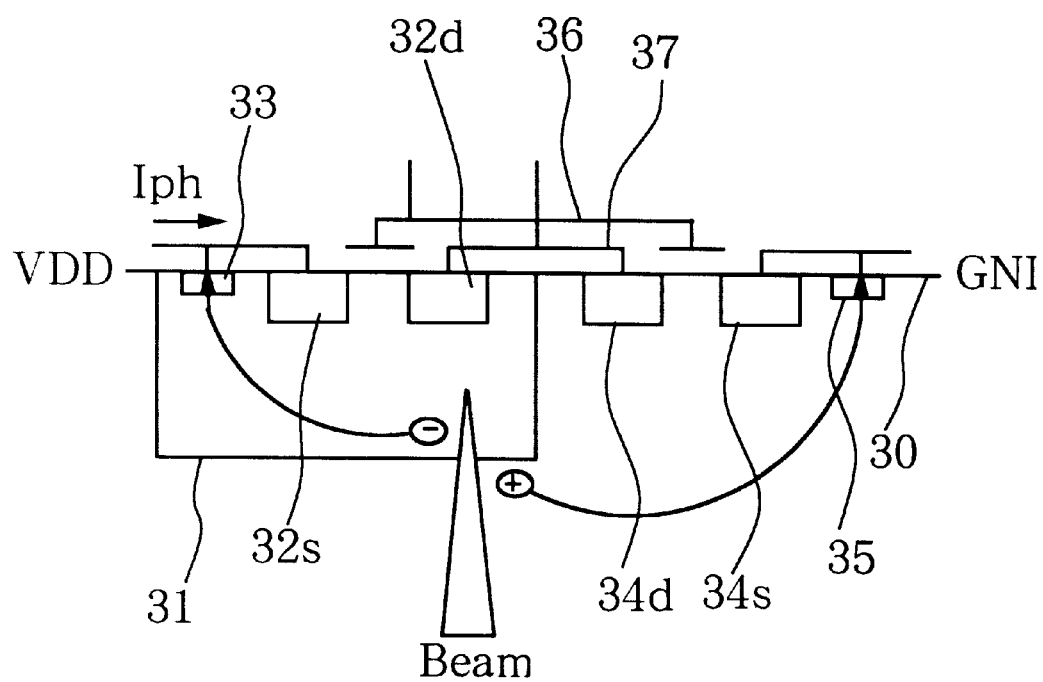
FIG. 18 is a sectional view for explaining a state of generating malfunction in the case of logical detection by the back OBIC system.

FIG. 18 is a sectional view for explaining a state of generating malfunction in the case of logical detection by the back OBIC system. Reference numerals indicated on FIG. 18 are the same as those of FIG. 17B, for example, which have already described those construction elements above, therefore, the description of those are omitted. Referring to FIG. 18, with irradiating the laser beam on the n-type impurity region 31, the electron of the generated electron-hole pair still flows in the direction of VDD clamping electrode 33 while the hole thereof also flows into the GND clamping electrode 35. Thus, the photo excitation current Iph still flows into the power source terminal of LSI, which indicates a state of logical decision even though the laser beam is irradiated on the n-type impurity region 31 far from the drain electrode 32d.

The embodiments have been described that the conductive type of semiconductor substrate 101 is the p-type, but the n-type may also be applicable.

It is thus apparent that the present invention is not limited to the above embodiments but may be changed and modified without departing from the scope and spirit of the invention.

Finally, the present application claims the priority of Japanese Patent Application No. Hei 09-044004 filed Feb. 27, 1997, which is herein incorporated by reference.

What is claimed is:

1. A semiconductor integrated circuit having a logic verification structure, comprising: a logic circuit formed of a CMOS structure on a semiconductor substrate of a first conductive type; and, an impurity region formed on the semiconductor substrate, the impurity region being of a second conductive type opposite to the first conductive type to provide only one pn junction between the impurity region and a back surface of the semiconductor substrate, wherein the impurity region is connected with an output wiring of the logic circuit but independent from the logic circuit, wherein the pn junction is irradiated by a laser beam from the back surface of the semiconductor substrate to generate an electron-hole pair, an electron of which pair is supplied from the impurity region to the output wiring to reveal a logic state of the logic circuit.

2. A semiconductor integrated circuit according to claim 1, wherein the impurity region has a conductive type different from that of the semiconductor substrate and is electronically independent from a semiconductor device region forming a source voltage clamping region and the logic circuit.

3. A semiconductor integrated circuit according to claim 2, wherein the impurity region is aligned and arranged on a predetermined area on the semiconductor substrate and is connected to an output portion of the logic circuit to be tested through a pattern wiring.

4. A semiconductor integrated circuit according to claim 3, wherein the impurity region is connected the pattern wiring through a contact hole provided on the impurity region.

5. A semiconductor integrated circuit according to claim 4, wherein the impurity region is connected to the pattern wiring through the contact hole and coated by the pattern wiring.

6. A semiconductor integrated circuit according to claim 5, wherein the impurity region is aligned and arranged with a pitch similar to that of the pattern wiring formed on the semiconductor substrate.

7. A semiconductor integrated circuit according to claim 6, wherein the pattern wiring comprises an electronic circuit and is independent from the electronic circuit.

8. A semiconductor integrated circuit according to claim 7, wherein the pattern wiring connected to the impurity region through the contact hole is connected to an upper-layered pattern wiring intersecting at the pattern wiring.

9. A semiconductor integrated circuit according to claim 8, wherein the predetermined area on the semiconductor substrate is provided within a wiring area of the pattern wiring located between cell group regions where a cell group as semiconductor devices comprising a basic logic circuit is aligned and arranged.

10. A semiconductor integrated circuit according to claim 8, wherein the predetermined area on the semiconductor substrate is dispersedly provided between the cell groups within the cell group region.

11. A semiconductor integrated circuit according to claim 8, wherein the predetermined area on the semiconductor substrate occupies a specific area in the semiconductor substrate.

12. A semiconductor integrated circuit having a logic verification structure including a logic circuit formed of a CMOS structure on a semiconductor substrate, comprising:

a semiconductor substrate having a first conductive type;

an impurity region formed on the semiconductor substrate, the impurity region having a second conductive type opposite to the first conductive type to provide only one pn junction between the impurity region and a back surface of the semiconductor substrate, wherein the impurity region is electrically connected with an output wiring of the logic circuit but independent from the logic circuit;

an insulation film formed on the semiconductor substrate and the impurity region;

a contact hole formed on the impurity region by opening the insulation film;

a pattern wiring formed on the insulation film and the contact hole;

a signal pattern wiring formed above the pattern wiring, a part of which is overlapped with the signal pattern wiring;

wherein in the pn junction generates an electron-hole pair upon being irradiated with a laser beam, an electron of which pair is supplied from the impurity region to the output wiring to reveal the logic circuit in logic state.

13. A semiconductor integrated circuit according to claim 12, wherein the contact is a logic detecting pattern for detecting a photo excitation current.

14. A semiconductor integrated circuit according to claim 12, wherein the semiconductor substrate has an n-type conductive substrate.

15. A semiconductor integrated circuit according to claim 12, wherein the semiconductor substrate has a p-type conductive substrate.

16. A semiconductor integrated circuit according to claim 12, wherein the pattern wiring is connected with the signal pattern wiring by irradiating a laser beam.

17. A semiconductor integrated circuit according to claim 12, wherein the pattern wiring is connected with the signal pattern wiring by a mechanical compression.

* * * * *